(12) United States Patent
Hou et al.

(10) Patent No.: US 10,761,118 B2
(45) Date of Patent: Sep. 1, 2020

(54) BATTERY HIGH VOLTAGE SAMPLING CIRCUIT AND BATTERY MANAGEMENT SYSTEM

(71) Applicant: Contemporary Amperex Technology Co., Limited, Ningde, Fujian (CN)

(72) Inventors: Yizhen Hou, Ningde (CN); Zhanyu Sun, Ningde (CN); Zhimin Dan, Ningde (CN); Jiechao Luo, Ningde (CN); Wei Zhang, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 195 days.

(21) Appl. No.: 16/112,720

(22) Filed: Aug. 26, 2018

(65) Prior Publication Data
US 2019/0064230 A1 Feb. 28, 2019

(30) Foreign Application Priority Data
Aug. 29, 2017 (CN) .......................... 2017 1 0756909

(51) Int. Cl.
*G01R 19/165* (2006.01)
*G01R 19/25* (2006.01)
*G01R 31/36* (2020.01)

(52) U.S. Cl.
CPC ... *G01R 19/16542* (2013.01); *G01R 19/2509* (2013.01); *G01R 31/3648* (2013.01)

(58) Field of Classification Search
CPC .......... G01R 19/16542; G01R 19/2509; G01R 31/3648

USPC ....................................... 324/433; 340/636.1
See application file for complete search history.

(56) References Cited

U.S. PATENT DOCUMENTS

2014/0159908 A1* 6/2014 Hong ..................... G01R 31/50
340/636.1

FOREIGN PATENT DOCUMENTS

| CN | 106199440 A | 12/2016 |
|---|---|---|
| DE | 102006050529 A1 | 4/2008 |

OTHER PUBLICATIONS

Extended European Search Report for European Application No. 18191317.9,dated Feb. 11, 2019, 7 pages.

* cited by examiner

*Primary Examiner* — Farhana A Hoque
(74) *Attorney, Agent, or Firm* — Law Offices of Liaoteng Wang (57) ABSTRACT

The present disclosure provides a battery high voltage sampling circuit and a battery management system. The battery high voltage sampling circuit includes a positive relay, a negative relay, a first positive sampling unit, a first negative sampling unit and a reference voltage terminal, wherein: a first terminal of the positive relay is connected to a positive electrode of a power battery pack to be detected, a first terminal of the negative relay is connected to a negative electrode of the power battery pack to be detected, and both of the first positive sampling unit and the first negative sampling unit are connected to the reference voltage terminal.

19 Claims, 7 Drawing Sheets

BATTERY HIGH VOLTAGE SAMPLING CIRCUIT AND BATTERY MANAGEMENT SYSTEM

CROSS-REFERENCE TO RELATED APPLICATION

This application is based upon and claims priority to Chinese Patent Application No. 201710756909.3, filed on Aug. 29, 2017, the content of which is incorporated herein by reference in its entirety.

FIELD

The present disclosure relates to the field of batteries, and more particularly to a battery high voltage sampling circuit and a battery management system.

BACKGROUND

Power battery pack is responsible for storing and supplying power. In use, it is necessary to acquire a power supply voltage of the power battery pack to monitor whether the power supply voltage of the power battery pack has reached a standard voltage in real time, so as to reduce the risk of the power supply from the power battery pack.

At present, in a battery high voltage sampling circuit, the power battery pack and a sampling unit are usually set to not be connected to a common ground. Specifically, it means that positive and negative electrodes of the power battery pack are grounded at a high voltage, while the sampling unit is grounded at a low voltage. In order to isolate a high voltage ground signal of the power battery pack from interfering with a sampled signal of the sampling unit, an insolation unit may be additionally disposed after the sampling unit.

However, the inventor of the application has discovered that the existing insolation unit may further introduce a new interference signal while isolating the high voltage ground signal of the power battery pack, which results in a decrease in the accuracy of the sampled signal.

SUMMARY

The present disclosure provides a battery high voltage sampling circuit and a battery management system.

According to an aspect of embodiments of the present disclosure, a battery high voltage sampling circuit is provide. The battery high voltage sampling circuit may include a positive relay, a negative relay, a first positive sampling unit, a first negative sampling unit and a reference voltage terminal, wherein: a first terminal of the positive relay is connected to a positive electrode of a power battery pack to be detected, a first terminal of the negative relay is connected to a negative electrode of the power battery pack to be detected, and both of the first positive sampling unit and the first negative sampling unit are connected to the reference voltage terminal; the first positive sampling unit is configured to acquire a first positive sampled signal at the first terminal of the positive relay; and the first negative sampling unit is configured to acquire a first negative sampled signal at the first terminal of the negative relay.

According to another aspect of embodiments of the present disclosure, a battery management system is provided. The battery management system may include the above-described battery high voltage sampling circuit and a processor connected to the battery high voltage sampling circuit. The processor may be configured to calculate a voltage at the first terminal of the positive relay based on the first positive sampled signal; calculate a voltage at the first terminal of the negative relay based on the first negative sampled signal; and obtain a relay-input voltage of the power battery pack to be detected, based on the voltage at the first terminal of the positive relay and the voltage at the first terminal of the negative relay, wherein the relay-input voltage of the power battery pack to be detected is a voltage between the first terminal of the positive relay and the first terminal of the negative relay.

BRIEF DESCRIPTION OF THE DRAWINGS

To more clearly illustrate technical solutions of embodiments of the present disclosure, the accompanying drawings, which are to be referred by the embodiments of the present disclosure, will be briefly described. Those skilled in the art will be able to obtain additional drawings in accordance with these drawings without any creative work.

DETAILED DESCRIPTION

Various aspects of features and exemplary embodiments of the present disclosure will be described in detail below. The present disclosure will be provided in further detail below in conjunction with accompanying drawings and embodiments in order to make objects, technical solutions and advantages of the present disclosure to be more clearly understood. It is to be appreciated that the specific embodiments described herein are to be construed to illustrate the present disclosure but not to limit the present disclosure. It will be apparent to those skilled in the art that the present disclosure may be practiced without some of these specific details. The following description of the embodiments is merely to provide a better understanding of the present disclosure by illustrating examples thereof.

It is to be noted that relational terms such as first, second and the like are used herein only to distinguish an entity or operation from another entity or operation without requiring or implying that there is any such actual relationship or order between these entities or operations. Moreover, the term "comprise", "include" or any other variant thereof is intended to encompass a non-exclusive inclusion, such that a process, method, article or device that includes a series of elements includes not only these elements but also other elements that are not explicitly listed or those elements that are inherent to such a process, method, article or device. In the absence of more restrictions, elements defined by the statement "includes . . ." do not preclude the presence of additional identical elements in the process, method, article or device that includes the elements.

In embodiments of the present disclosure, in terms of battery type, the battery pack to be detected may be a lithium ion battery, a lithium metal battery, a lead acid battery, a nickel cadmium battery, a nickel hydrogen battery, a lithium sulfur battery, a lithium air battery, or a sodium ion, which is not particularly limited in the embodiments of the present disclosure. In terms of battery scale, the battery pack to be detected may be a cell or a battery unit or a battery package, which is not particularly limited in the embodiments of the present disclosure.

For a better understanding of the present disclosure, the embodiments of the present disclosure will be described in detail with reference to the accompanying drawings. It is to be noted that these embodiments are not intended to limit the scope of the present disclosure.

It is to be understood that the embodiments of the present disclosure are not limited to the specific configurations and processes described above and shown in the drawings. Also, for the purpose of concision, the detailed description of known technique is omitted herein. In the above embodiments, a number of specific steps are described and illustrated as examples. However, the processes of the embodiments of the present disclosure are not limited to the specific steps described and illustrated. A person skilled in the art may make various changes, modifications and additions, or change the order of the steps after understanding the spirit of the present disclosure.

Figure 1:
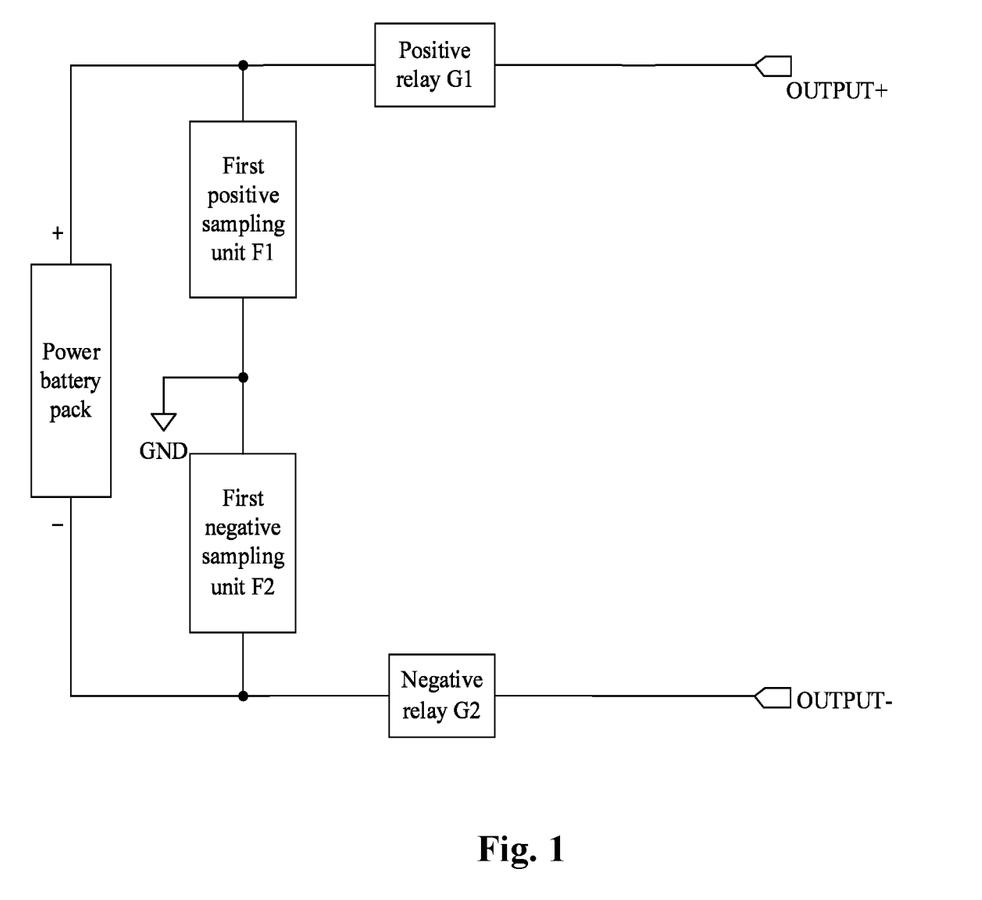
FIG. 1 is a schematic diagram showing a structure of a high voltage sampling circuit according to an embodiment of the present disclosure.

FIG. 1 is a schematic diagram showing a structure of a battery high voltage sampling circuit according to an embodiment of the present disclosure. As shown in FIG. 1, the battery high voltage sampling circuit may include a positive relay G1, a negative relay G2, a first positive sampling unit F1, a first negative sampling unit F2, and a reference voltage terminal GND.

In the embodiment of the present disclosure, a first terminal of the positive relay may be connected to a positive electrode of a power battery pack to be detected; a first terminal of the negative relay may be connected to a negative electrode of the power battery pack to be detected; and both the first positive sampling unit and the first negative sampling unit may be connected to the reference voltage terminal.

Further, the first positive sampling unit may be configured to acquire a first positive sampled signal at the first terminal of the positive relay; and the first negative sampling unit may be configured to acquire a first negative sampled signal at the first terminal of the negative relay.

In the embodiment, an actual voltage at the reference voltage terminal GND may be set in accordance with working scene and demand of a high voltage sampling circuit. The voltage at the reference voltage terminal GND can be regarded as the reference voltage of the high voltage sampling circuit in the embodiment. In other words, the reference voltage at the reference voltage terminal GND can be regarded as relative 0V.

As an example, if the actual voltage at the reference voltage terminal GND is 6V and the actual voltage of the sampled signal acquired at a first positive sampling point S1 is 22V, the reference voltage 6V can be recorded as 0V, and the voltage of the sampled signal acquired at the first positive sampling point S1 can be recorded as 16V.

In the high voltage sampling circuit, the other terminal of the first positive sampling unit F1 may be connected to the first positive sampling point S1 and the reference voltage terminal GND; the other terminal of the first negative sampling unit F2 may be connected to a first negative sampling point S2 and the reference voltage terminal GND.

In other words, both of a sampled voltage $U_{SP1}$ of the first positive sampled signal at the first positive sampling point S1 and a sampled voltage $U_{SP2}$ of the first negative sampled signal at the first negative sampling point S2 may share a same reference voltage.

As an example, the reference voltage terminal may be a low voltage ground.

When the reference voltage terminal GND is the low voltage ground, all of the first positive sampling unit F1, the first negative sampling unit F2, and the power battery pack to be detected may be connected to the common low voltage ground.

In the embodiments of the present disclosure, the first positive sampling unit F1 and the first negative sampling unit F2 may be provided. When these sampling units employ the same reference voltage (e.g. they are connected to the common low voltage ground), it is possible to avoid additionally providing the isolation unit for isolating the sampled signal due to the different reference voltage terminals, thereby simplifying the circuit structure, reducing the error caused by isolating the sampled signal, and thus improving the accuracy of the voltage of the sampled signal.

In some embodiments, when both of the above sampling units take the low voltage ground as a reference, the sampled voltage $U_{SP2}$ of the first negative sampled signal at the first negative sampling point S2 may be lower than the voltage (i.e. relative 0V) at the reference voltage terminal GND because of the voltage drop of the current. In this case, both the sampled voltage $U_{SP2}$ may be recorded as a negative voltage.

Therefore, in some embodiments, it may be necessary to apply a voltage pull-up process to the sampled voltage $U_{SP2}$ of the first negative sampled signal at the first negative sampling point S2

Figure 2:
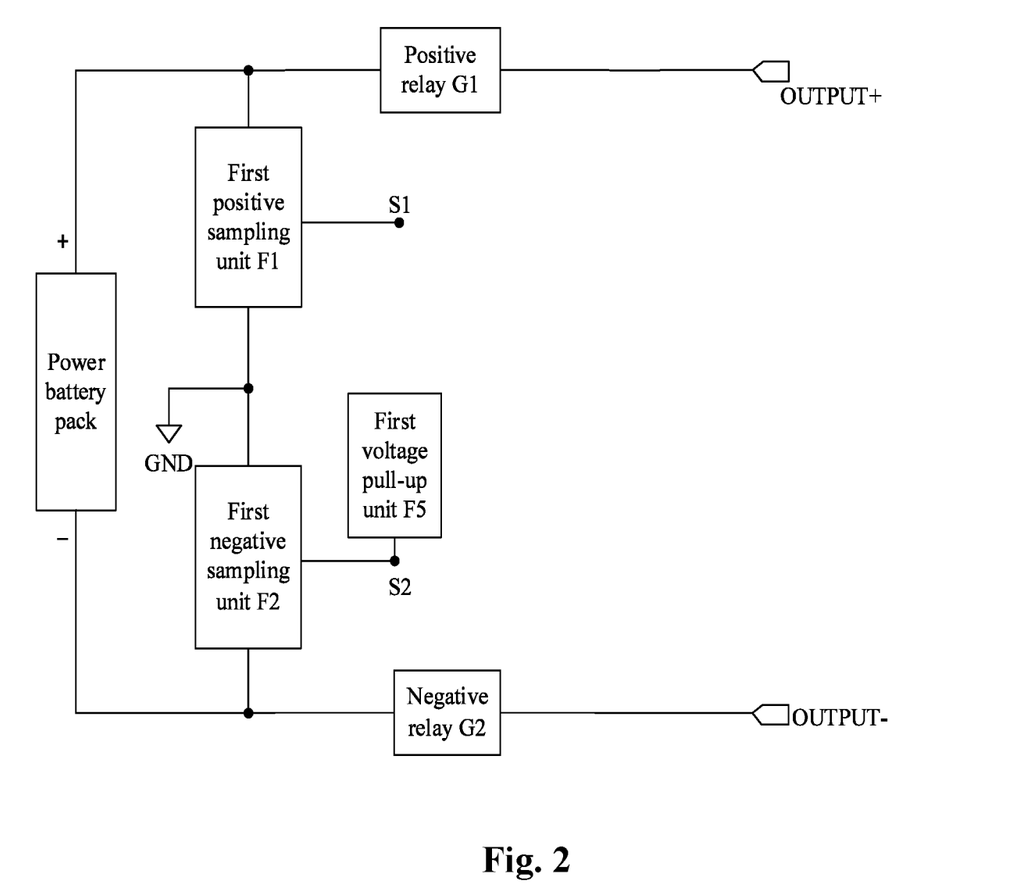
FIG. 2 is a schematic diagram showing a structure of a high voltage sampling circuit according to another embodiment of the present disclosure.

FIG. 2 is a schematic diagram showing a structure of a high voltage sampling circuit according to another embodiment of the present disclosure. As shown in FIG. 2, FIG. 2 differs from FIG. 1 in that, in some embodiments, the high voltage sampling circuit may further include a first voltage pull-up unit F5.

The first voltage pull-up unit F5 may be connected to the first negative sampling point S2, and the first voltage pull-up unit F5 may be configured to pull up the first negative sampled signal to be a positive voltage signal.

In the embodiment, the voltage of the first negative sampled signal at the first negative sampling point S2 can be pulled up by a preset pull-up voltage value, so that the output voltage $U_{SP2}$ of the first negative sampled signal at the first negative sampling point S2 may be higher than the voltage at the reference voltage terminal. That is, after the voltage pull-up process, the voltage $U_{SP2}$ of the first negative sampled signal at the first negative sampling point S2 may be recorded as a positive voltage.

Continuing with reference to FIG. 2, in an embodiment, the battery high voltage sampling circuit may further include the first positive sampling point S1 and the first negative sampling point S2.

In the embodiment, the first positive sampling unit may be further configured to provide the first positive sampled signal to the first positive sampling point; the first negative sampling unit may be further configured to provide the first negative sampled signal to the first negative sampling point.

The high voltage sampling circuit according to the embodiment of the present disclosure may conduct the high voltage sampling for the power battery pack connected in the high voltage sampling circuit, based on the first positive sampled signal acquired from the first positive sampling point S1 and the first negative sampled signal acquired from the first negative sampling point S2.

Next, referring to FIG. 3, a specific structure of the high voltage sampling circuit according to an embodiment of the present disclosure will be described in detail with reference to specific embodiments.

Figure 3:
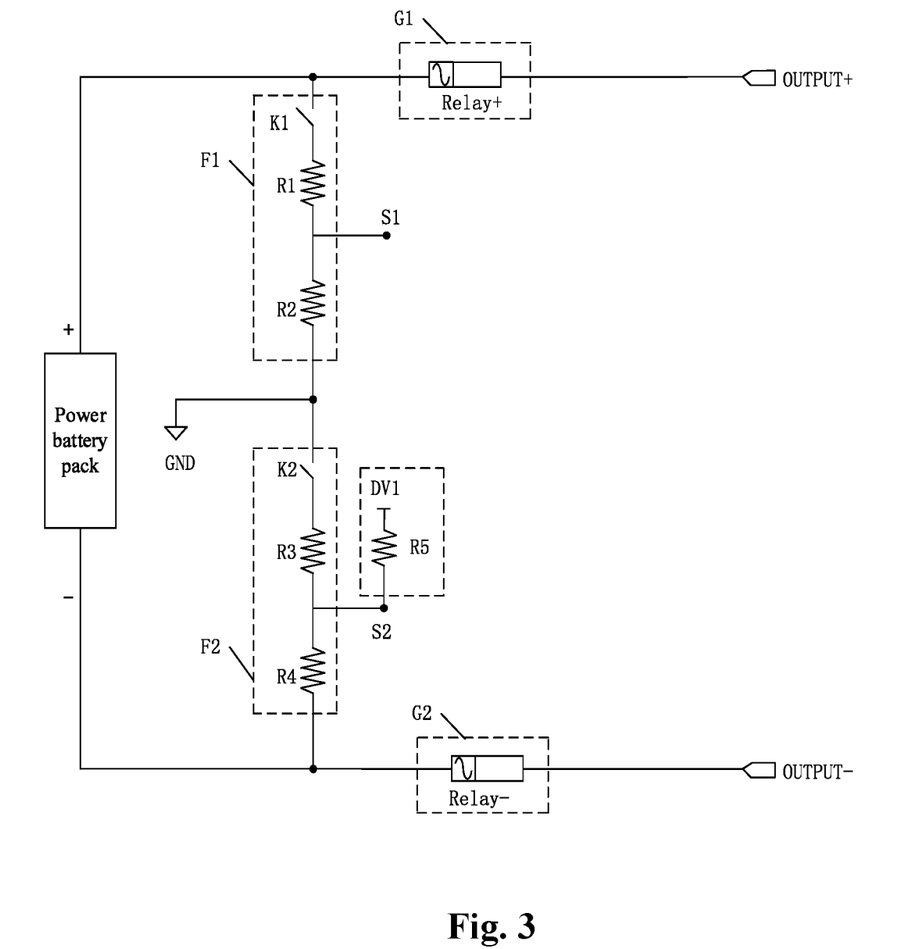
FIG. 3 is a circuit diagram of a high voltage sampling circuit according to an exemplary embodiment of the present disclosure.

FIG. 3 is a circuit diagram of a high voltage sampling circuit according to an exemplary embodiment of the present disclosure. FIG. 3 schematically shows specific structures of the first positive sampling unit F1, the first negative sampling unit F2 and the first voltage pull-up unit F5.

As shown in FIG. 3, in an embodiment, the first positive sampling unit F1 may include a first resistor network R1 and a second resistor network R2 in series.

A terminal of the first resistor network R1 may be connected to the first terminal of the positive relay G1 and the positive electrode of the battery pack to be detected, and the other terminal of the first resistor network R1 may be connected to the first positive sampling point S1 and a terminal of the second resistor network R2.

The other terminal of the second resistor network R2 may be connected to the reference voltage terminal GND.

In an example, the resistor network form and the resistance value of the first resistor network R1 may be the same as the resistor network form and the resistance value of the second resistor network R2.

In the embodiment, the first resistor network R1 and the second resistor network R2 may function as a divider. The range of the first positive sampled signal at the first positive sampling point S1 can be adjusted by adjusting the resistance value of the first resistor network R1 and the resistance value of the second resistor network R2.

In an embodiment, the first negative sampling unit F2 may include a third resistor network R3 and a fourth resistor network R4 in series.

A terminal of the third resistor network R3 may be connected to the reference voltage terminal GND, and the other terminal of the third resistor network R3 may be connected to the first negative sampling point S2 and a terminal of the fourth resistor network R4.

The other terminal of the fourth resistor network R4 may be connected to the first terminal of the negative relay G2 and the negative electrode of the battery pack to be detected.

In an example, the resistor network form and the resistance value of the third resistor network R3 may be the same as the resistor network form and the resistance value of the fourth resistor network R4.

In the embodiment, the third resistor network R3 and the fourth resistor network R4 may function as a divider. The range of the first negative sampled signal at the first negative sampling point S2 can be adjusted by adjusting the resistance value of the third resistor network R3 and the resistance value of the fourth resistor network R4.

Continuing with reference to FIG. 3, in an embodiment, the first voltage pull-up unit F5 may further include a first DC (Direct Current) voltage source DV1 and a fifth resistor network R5. A terminal of the fifth resistor network R5 may be connected to the first negative sampling point S2, and the other terminal of the fifth resistor network R5 may be connected to the first DC voltage source DV1.

In the embodiment, the first DC voltage source DV1 may generate a pull-up voltage U1. U1 may be a preset value and U1 may be greater than the voltage at the reference voltage terminal GND.

It is to be noted that each of the first resistor network R1 to the fifth resistor network R5 may include a single resistor, or may include two or more resistors in series and/or in parallel. In the high voltage sampling circuit as shown in FIG. 2, each of the first resistor network R1 to the fifth resistor network R5 may include a single resistor.

As an example, the resistor network form and the resistance value of each of the first resistor network R1 to the fifth resistor network R5 may be determined based on the sampling range and sampling accuracy of the high voltage sampling process conducted at the positive sampling point S1 and the negative sampling point S2. But the present disclosure is not limited to this.

As another example, the resistor network form and the resistance value of each of the first resistor network R1 to the fifth resistor network R5 may be determined based on a normally allowable sampling range of the sampling units for conducting the sampling at the positive sampling point S1 and the negative sampling point S2. But the present disclosure is not limited to this.

As a further example, the resistor network form and the resistance value of each of the first resistor network R1 to the fifth resistor network R5 may be determined based on a normal operating voltage tolerance range of components in an insulation detection circuit. But the present disclosure is not limited to this.

In a schematic example, the resistor network form and the resistance value of the first resistor network R1 may be the same as the resistor network form and the resistance value of the third resistor network R3. The resistor network form and the resistance value of the third resistor network R2 may be the same as the resistor network form and the resistance value of the fourth resistor network R4.

Continuing with reference to FIG. 3, in some embodiments, the first positive sampling unit F1 may further include a first switch K1. A terminal of the first resistor network R1 may be connected, via the first switch K1, to the positive electrode of the power battery pack to be detected.

In the embodiments, it is possible to control whether the first positive sampling point S1 provides the first positive sampled signal or not, by turning on or turning off the first switch K1. When the first switch K1 is turned on, the first positive sampling point S1 may provide the first positive sampled signal. When the first switch K1 is turned off, the first positive sampling point S1 may stop providing the first positive sampled signal.

In some embodiments, the first negative sampling unit F2 may further include a second switch K2. A terminal of the third resistor network R3 may be connected to the reference voltage terminal GND via the second switch K2.

In the embodiments, it is possible to control whether the first negative sampling point S2 provides the first negative sampled signal or not, by turning on or turning off the second switch K2. When the second switch K2 is turned on, the first negative sampling point S2 may provide the first negative sampled signal. When the second switch K2 is turned off, the first negative sampling point S2 may stop providing the first negative sampled signal.

Continuing with reference to FIG. 3, each of the first positive sampling point S1 and the first negative sampling point S2 may be connected to a sampling unit for implementing the sampling process. In an example, the sampling unit may be a component for performing a sampling function, e.g. an Analog to Digital Converter (ADC).

In an example, the high voltage sampling circuit may further include a first ADC (not shown in the figure). The first ADC may be connected to the first positive sampling point S1 and a processor C1. The first ADC may be configured to convert an analog signal acquired at the first positive sampling point S1 into a digital signal.

In another example, the high voltage sampling circuit may further include a second ADC (not shown in the figure). The second ADC may be connected to the first negative sampling point S2 and the processor C1. The second ADC may be configured to convert an analog signal acquired at the first negative sampling point S2 into a digital signal.

It is to be noted that a common ADC can be provided for both the first positive sampling point S1 and the first negative sampling point S2. Both the analog signal acquired at the first positive sampling point S1 and the analog signal acquired at the first negative sampling point S2 can be converted into a digital signal respectively by the common ADC.

Figure 4:
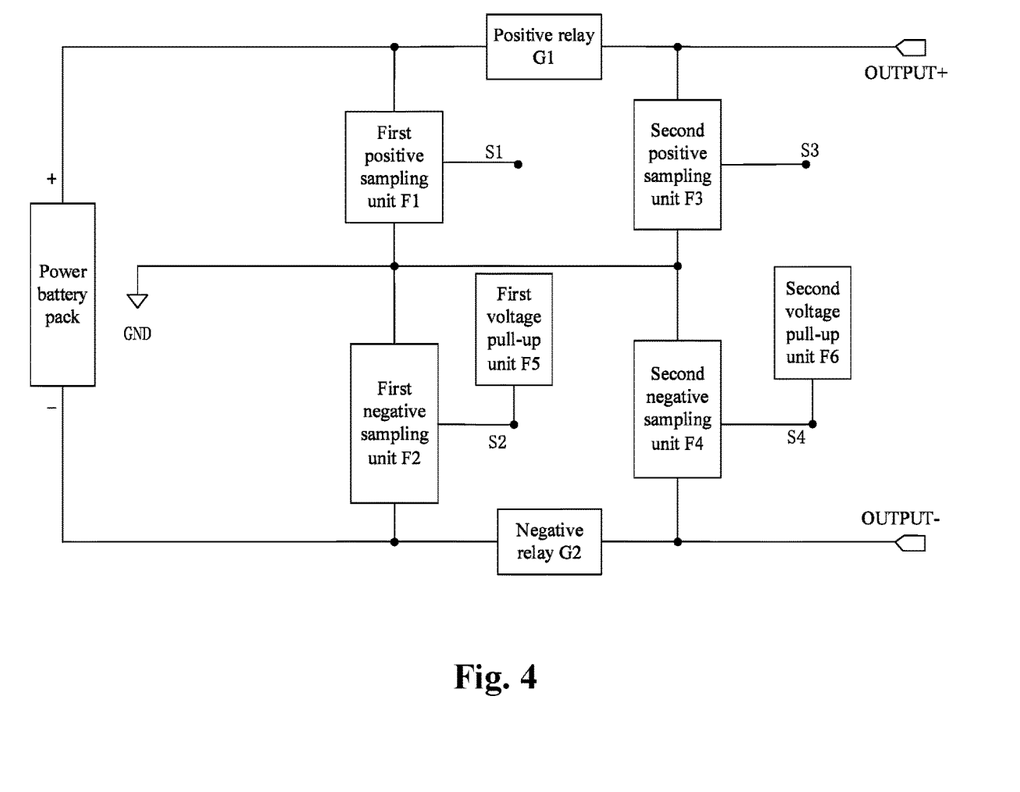
FIG. 4 is a schematic diagram showing a structure of a high voltage sampling circuit according to a further embodiment of the present disclosure.

FIG. 4 is a schematic diagram showing a structure of a high voltage sampling circuit according to a further embodiment of the present disclosure. FIG. 4 differs from FIG. 1 in that the high voltage sampling circuit may further include a second positive sampling unit F3, a second negative sampling unit F4, a second voltage pull-up unit F6, a second positive sampling point S3 and a second negative sampling point S4.

It is to be noted that the embodiments of the present disclosure are not limited to the description in the above embodiment and the specific units shown in FIG. 4. In some embodiments, the battery high voltage sampling circuit may include only a portion of the units therein. That is, the battery high voltage sampling circuit in the embodiments of the present disclosure may include a more flexible unit configuration, which will be described below in connection with specific embodiments.

As shown in FIG. 4, a terminal of the second positive sampling unit F3 may be connected to the second terminal of the positive relay G1; the other terminal of the second positive sampling unit F3 may be connected to the second positive sampling point S3 and the reference voltage terminal GND; and the second positive sampling unit F3 may be configured to provide the second positive sampled signal to the second positive sampling point S3.

A terminal of the second negative sampling unit F4 may be connected to the second terminal of the negative relay G2; the other terminal of the second negative sampling unit F4 may be connected to the second negative sampling point S4 and the reference voltage terminal GND; and the second negative sampling unit F4 may be configured to provide the second negative sampled signal to the second negative sampling point S4.

In the embodiment, the other terminal of the second positive sampling unit F3 may be connected to the second positive sampling point S3 and the reference voltage terminal GND; the other terminal of the second negative sampling unit F4 may be connected to a second negative sampling point S4 and the reference voltage terminal GND.

In other words, both of a sampled voltage $U_{SP3}$ of the second positive sampled signal at the second positive sampling point S3 and a sampled voltage $U_{SP4}$ of the second negative sampled signal at the second negative sampling point S4 may share a same reference voltage.

As an example, the reference voltage terminal may be a low voltage ground.

When the reference voltage terminal GND is the low voltage ground, all of the second positive sampling unit F3, the second negative sampling unit F4, and the power battery pack to be detected may be connected to the common low voltage ground.

In the embodiments of the present disclosure, the voltages of the power battery pack may be detected by the second positive sampling unit F3 and the second negative sampling unit F4. When these sampling units employ the same reference voltage (e.g. they are connected to the common low voltage ground), it is possible to avoid the need of additionally providing the isolation unit for isolating the sampled signal due to the different reference voltage terminals, thereby simplifying the circuit structure, reducing the error caused by isolating the sampled signal, and thus improving the accuracy of the voltage of the sampled signal.

In some embodiments, when all of the above sampling units take the low voltage ground as a reference, the sampled voltage $U_{SP4}$ of the second negative sampled signal at the second negative sampling point S4 may be lower than the voltage (i.e. relative 0V) at the reference voltage terminal GND because of the voltage drop of the current. In this case, the sampled voltage $U_{SP4}$ may be recorded as a negative voltage.

Therefore, in some embodiments, it may be necessary to apply a voltage pull-up process to the sampled voltage $U_{SP4}$ of the second negative sampled signal at the second negative sampling point S4.

Continuing with reference to FIG. 3, in an embodiment, the high voltage sampling circuit may further include the second voltage pull-up unit F6. The second voltage pull-up unit F6 may be connected to the second negative sampling point S4, and the second voltage pull-up unit F6 may be configured to pull up the second negative sampled signal to be a positive voltage signal.

In the embodiment, the voltage of the second negative sampled signal at the second negative sampling point S4 may be pulled up by a preset pull-up voltage value, so that the output voltage $U_{SP4}$ of the second negative sampled signal at the second negative sampling point S4 may be higher than the voltage at the reference voltage terminal. That is, after the voltage pull-up process, the voltage $U_{SP4}$ of the second negative sampled signal at the second negative sampling point S4 may be recorded as a positive voltage.

The high voltage sampling circuit according to the embodiment of the present disclosure may implement the high voltage sampling for the power battery pack connected in the high voltage sampling circuit, based on the first positive sampled signal acquired from the first positive sampling point S1, the first negative sampled signal acquired from the first negative sampling point S2, the second positive sampled signal acquired from the second positive sampling point S3 and the second negative sampled signal acquired from the second negative sampling point S4.

Figure 5:
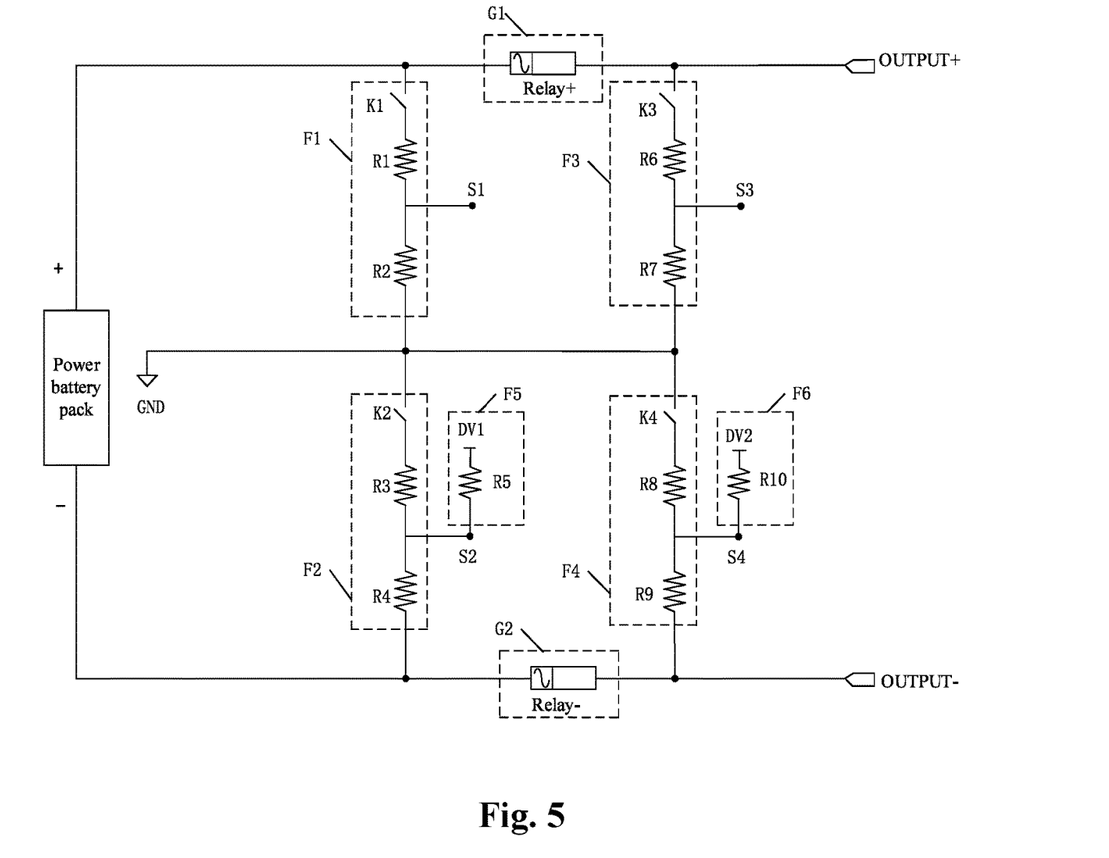
FIG. 5 is a circuit diagram of a high voltage sampling circuit according to another exemplary embodiment of the present disclosure.

FIG. 5 shows a circuit diagram of a high voltage sampling circuit according to another embodiment of the present disclosure. As shown in FIG. 5, each of the second negative sampling unit F4, the first voltage pull-up unit F5, and the second voltage pull-up unit F6 may be composed of components. The specific structure of each of the second negative sampling unit F4, the first voltage pull-up unit F5, and the second voltage pull-up unit F6 may be described in the following examples.

In an example, the second positive sampling unit F3 may include a sixth resistor network R6 and a seventh resistor network R7 in series.

A terminal of the sixth resistor network R6 may be connected to the second terminal of the positive relay G1, the other terminal of the sixth resistor network R6 may be connected to the second positive sampling point S3 and a terminal of the seventh resistor network R7; and the other terminal of the seventh resistor network R7 may be connected to the reference voltage terminal GND.

In some examples, the resistor network form and the resistance value of the sixth resistor network R6 may be the same as the resistor network form and the resistance value of the seventh resistor network R7.

In the embodiment, the sixth resistor network R6 and the seventh resistor network R7 may function as a divider. The range of the second positive sampled signal from the second positive sampling unit F3 can be adjusted by adjusting the resistance value of the sixth resistor network R6 and the resistance value of the seventh resistor network R7.

In an embodiment, the second negative sampling unit F4 may include an eighth resistor network R8 and a ninth resistor network R9 in series.

A terminal of the eighth resistor network R8 may be connected to the reference voltage terminal GND, the other terminal of the eighth resistor network R8 may be connected to the second negative sampling point S4 and a terminal of the ninth resistor network R9; and the other terminal of the ninth resistor network R9 may be connected to the second terminal of the negative relay G2.

In some examples, the resistor network form and the resistance value of the eighth resistor network R8 may be the same as the resistor network form and the resistance value of the ninth resistor network R9.

In the embodiment, the eighth resistor network R8 and the ninth resistor network R9 may function as a divider. The range of the second negative sampled signal from the second negative sampling unit F4 can be adjusted by adjusting the resistance value of the eighth resistor network R8 and the resistance value of the ninth resistor network R9.

Continuing with reference to FIG. 5, in an embodiment, the second voltage pull-up unit F6 may further include a second DC voltage source DV2 and a tenth resistor network R10. A terminal of the tenth resistor network R10 may be connected to the second negative sampling point S4, and the other terminal of the tenth resistor network R10 may be connected to the second DC voltage source DV2.

In the embodiment, the second DC voltage source DV2 may generate a pull-up voltage U2. U2 may be a preset value and U2 may be greater than the voltage at the reference voltage terminal GND.

In an example, the pull-up voltage U1 and the pull-up voltage U2 can be set to have a same pull-up voltage value.

In the high voltage sampling circuit shown in FIG. 5, each of the first resistor network R1 to the tenth resistor network R10 may include a single resistor. In some other embodiments, each of the first resistor network R1 to the tenth resistor network R10 may include two or more resistors in series and/or in parallel.

It is to be noted that the resistor network form and the resistance value of each of the first resistor network R1 to the tenth resistor network R10 may be set according to the actual situation in the actual application scenario of the battery detection.

As an example, the resistor network form and the resistance value of each of the first resistor network R1 to the tenth resistor network R10 may be determined based on the demanded sampling accuracy and sampling range for the high voltage sampling process conducted by the high voltage sampling circuit, the sampling range limit and the achievable sampling accuracy of the sampling units in the above described embodiments of the high voltage sampling circuit, the tolerance range of operating voltage of components in the high voltage sampling circuit, and the like.

Continuing with reference to FIG. 5, in some embodiments, the second positive sampling unit F3 may further include a third switch K3. A terminal of the sixth resistor network R6 may be connected to the second terminal of the positive relay G1 via the third switch K3.

In the embodiments, it is possible to control whether the second positive sampling point S3 provides the second positive sampled signal or not, by turning on or turning off the third switch K3. When the third switch K3 is turned on, the second positive sampling point S3 may provide the second positive sampled signal. When the third switch K3 is turned off, the second positive sampling point S3 may stop providing the second positive sampled signal.

In some embodiments, the second negative sampling unit F4 may further include a fourth switch K4. A terminal of the eighth resistor network R8 may be connected to the reference voltage terminal GND via the fourth switch K4.

In the embodiments, it is possible to control whether the second negative sampling point S4 provides the second negative sampled signal or not, by turning on or turning off the fourth switch K4. When the fourth switch K4 is turned on, the second negative sampling point S4 may provide the second negative sampled signal. When the fourth switch K4 is turned off, the second negative sampling point S4 may stop providing the second negative sampled signal.

It is to be noted that the provision of the above described first switch K1, second switch K2, third switch K3 and fourth switch K4 may be determined depending on the specific operating scene or operating demands. In an example, any one or more of the first switch K1, the second switch K2, the third switch K3 and the fourth switch K4 may be provided in the high voltage sampling circuit. The switch may include, but not be limited to, any component having the switching function. For example, the switch may be a mechanical switch such as a single-pole-single-throw switch or an electronic switch such as a transistor and a MOSFET (Metal-Oxide-Semiconductor Field-Effect Transistor).

Next, a method of implementing the high voltage sampling for the power battery pack by the battery management system according to the embodiments of the present disclosure and steps thereof will be described in detail in the following specific embodiments by referring to FIG. 6.

Figure 6:
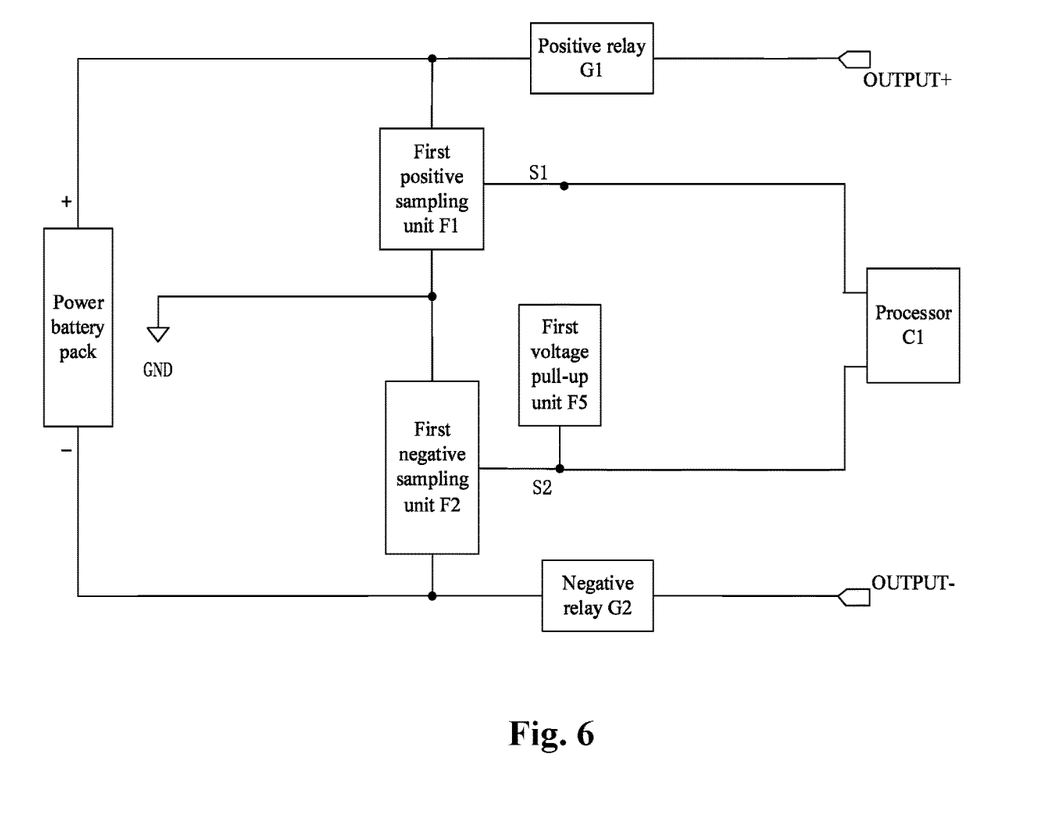
FIG. 6 is a schematic diagram showing a structure of a battery management system according to an embodiment of the present disclosure.

FIG. 6 is a schematic diagram showing a structure of a battery management system according to an embodiment of the present disclosure. As shown in FIG. 6, the battery management system may include the high voltage sampling circuit in the above embodiments and a processor C1 connected to the high voltage sampling circuit. The processor C1 may monitor the state of a high voltage circuit of the power battery pack, based on the first positive sampled signal and the first negative sampled signal acquired from the high voltage sampling circuit.

The processor C1 may be connected to the first positive sampling point S1 and the first negative sampling point S2 of the high voltage sampling circuit. The processor C1 may be configured to calculate a relay-input voltage of the power battery pack based on the first positive sampled signal and the first negative sampled signal, wherein the relay-input voltage of the power battery pack is a voltage between the first terminal of the positive relay G1 and the first terminal of the negative relay G2.

The processor C1 may be further configured to calculate a voltage at the first terminal of the positive relay based on the first positive sampled signal, calculate a voltage at the first terminal of the negative relay based on the first negative sampled signal, and obtain the relay-input voltage of the power battery pack by summing up the voltage at the first terminal of the positive relay and the voltage at the first terminal of the negative relay.

Particularly, in an example, when both K1 and K2 are simultaneously turned on, the first positive sampling signal may be supplied from the first positive sampling point S1, and the first negative sampling signal may be supplied from the first negative sampling point S2.

The processor C1 may calculate the voltage (i.e. a positive-terminal-relay-input voltage of the power battery pack) at the first terminal of the positive relay G1 based on the first positive sampled signal.

The processor C1 may calculate the voltage (i.e. a negative-terminal-relay-input voltage of the power battery pack) at the first terminal of the negative relay G2 based on the first negative sampled signal.

The processor C1 may obtain the relay-input voltage of the power battery pack based on the voltage at the first terminal of the positive relay G1 and the voltage at the first terminal of the negative relay G2.

In an example, the relay-input voltage of the power battery pack may be calculated according to the following Formulas (1), (2) and (3).

$$U_{B+(input)} = \frac{U_{sp1}(R_1 + R_2)}{R_2} \quad (1)$$

$$U_{B-(input)} = \frac{U_{sp2}(R_3 + R_4)}{R_3} \quad (2)$$

$$U_{B(input)} = U_{B+(input)} + U_{B-(input)} \quad (3)$$

In the above Formulas (1), (2) and (3), $U_{B\ (input)}$ indicates the relay-input voltage of the power battery pack; $U_{B+(input)}$ indicates the positive-terminal-relay-input voltage of the power battery pack; $U_{B-(input)}$ indicates the negative-terminal-relay-input voltage of the power battery pack; $U_{sp1}$ indicates the sampled voltage of the first positive sampled signal supplied from the first positive sampling point S1; $U_{sp2}$ indicates the sampled voltage of the first negative sampled signal supplied from the first negative sampling point S2; $R_1$ indicates the resistance value of the first resistor network; $R_2$ indicates the resistance value of the second resistor network; $R_3$ indicates the resistance value of the third resistor network; and $R_4$ indicates the resistance value of the fourth resistor network.

In the embodiments of the present disclosure, the processor C1 in the battery management system can calculate the relay-input voltage of the power battery pack according to the acquired first positive sampled signal and first negative sampled signal, so as to monitor the state of a high voltage circuit of the power battery pack based on the voltage of the high voltage circuit at the relay-input side of the power battery pack.

Figure 7:
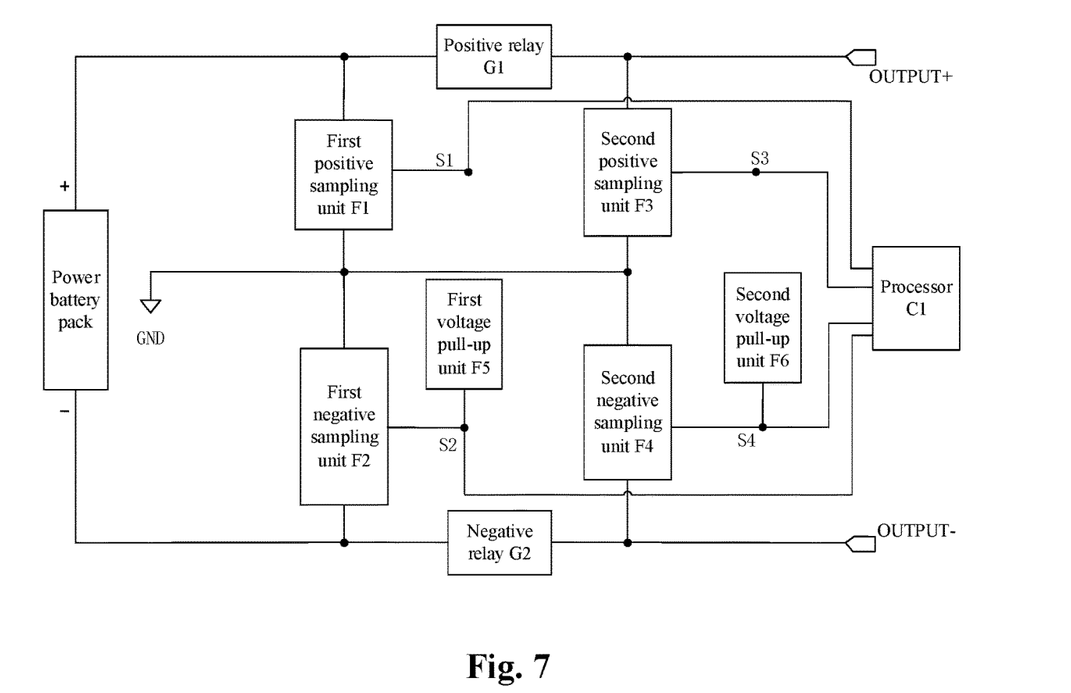
FIG. 7 is a schematic diagram showing a structure of a battery management system according to another embodiment of the present disclosure.

FIG. 7 is a schematic diagram showing a structure of a battery management system according to another embodiment of the present disclosure. In a schematic example, as shown in FIG. 7, the processor C1 may be connected to the first positive sampling point S1 and the first negative sampling point S2 of the high voltage sampling circuit, and may also be connected to the second positive sampling point S3 and the second negative sampling point S4 of the high voltage sampling circuit.

In an example, the processor C1 may be further configured to calculate a relay-output voltage of the power battery pack based on the second positive sampled signal and the second negative sampled signal, wherein the relay-output voltage of the power battery pack is a voltage between the second terminal of the positive relay G1 and the second terminal of the negative relay G2.

In an example, the processor C1 may be further configured to calculate a voltage at the second terminal of the positive relay based on the second positive sampled signal, calculate a voltage at the second terminal of the negative relay based on the second negative sampled signal, and obtain the relay-output voltage of the power battery pack by summing up the voltage at the second terminal of the positive relay G1 and the voltage at the second terminal of the negative relay G2.

Particularly, when both K3 and K4 are simultaneously turned on, the second positive sampling signal may be supplied from the second positive sampling point S3, and the second negative sampling signal may be supplied from the second negative sampling point S4.

The processor C1 may calculate the voltage (i.e. a positive-terminal-relay-output voltage of the power battery pack) at the second terminal of the positive relay G1 based on the second positive sampled signal.

The processor C1 may calculate the voltage (i.e. a negative-terminal-relay-output voltage of the power battery pack) at the second terminal of the negative relay G2 based on the second negative sampled signal.

The processor C1 may obtain the relay-output voltage of the power battery pack based on the voltage at the second terminal of the positive relay G1 and the voltage at the second terminal of the negative relay G2.

In other words, the processor C1 may obtain the relay-output voltage of the power battery pack based on the positive-terminal-relay-output voltage of the power battery pack and the negative-terminal-relay-output voltage of the power battery pack.

Particularly, the relay-output voltage of the power battery pack may be calculated according to the following Formulas (4), (5) and (6).

$$U_{B+(output)} = \frac{U_{sp3}(R_6 + R_7)}{R_7} \quad (4)$$

$$U_{B-(output)} = \frac{U_{sp4}(R_8 + R_9)}{R_8} \quad (5)$$

$$U_{B(output)} = U_{B+(output)} + U_{B-(output)} \quad (6)$$

In the above Formulas (4), (5) and (6), $U_{B\ (output)}$ indicates the relay-output voltage of the power battery pack; $U_{B+(output)}$ indicates the positive-terminal-relay-output voltage of the power battery pack; $U_{B-(output)}$ indicates the negative-terminal-relay-output voltage of the power battery pack; $U_{sp3}$ indicates the sampled voltage of the second positive sampled signal supplied from the second positive sampling point S3; $U_{sp4}$ indicates the sampled voltage of the second negative sampled signal supplied from the second negative sampling point S4; $R_6$ indicates the resistance value of the sixth resistor network; $R_7$ indicates the resistance value of the seventh resistor network; $R_8$ indicates the resistance value of the eighth resistor network; and $R_9$ indicates the resistance value of the ninth resistor network.

In the embodiments of the present disclosure, the processor C1 in the battery management system can calculate the relay-input voltage and the relay-output voltage of the power battery pack according to the acquired first positive sampled signal, first negative sampled signal, second positive sampled signal and second negative sampled signal, so that the high voltage sampling process can be implemented by the high voltage sampling circuit and the voltage of the power battery pack can be acquired and monitored.

The above description is only for illustrating the specific embodiments of the present disclosure. It will be apparent to those skilled in the art that, for the sake of convenience and simplicity of description, specific operating processes of the systems, units and elements described above may be known by referring to corresponding processes in the foregoing method embodiments, and will not be repeated herein. It is to be understood that the scope of the present disclosure is not limited thereto. Within the technical scope of the present disclosure, various modifications or substitutions may be readily apparent to those skilled in the art, and all of the modifications or substitutions are to be included within the scope of the present disclosure.

What is claimed is:

1. A battery high voltage sampling circuit comprising a positive relay, a negative relay, a first positive sampling unit, a first negative sampling unit, a second positive sampling unit, a second negative sampling unit and a reference voltage terminal, wherein:
    a first terminal of the positive relay is connected to a positive electrode of a power battery pack to be detected, a first terminal of the negative relay is connected to a negative electrode of the power battery pack to be detected, and both of the first positive sampling unit and the first negative sampling unit are connected to the reference voltage terminal;
    the first positive sampling unit is configured to acquire a first positive sampled signal at the first terminal of the positive relay;
    the first negative sampling unit is configured to acquire a first negative sampled signal at the first terminal of the negative relay;
    both of the second positive sampling unit and the second negative sampling unit are connected to the reference voltage terminal;
    the second positive sampling unit is configured to acquire a second positive sampled signal of the power battery pack at a second terminal of the positive relay; and
    the second negative sampling unit is configured to acquire a second negative sampled signal of the power battery pack at a second terminal of the negative relay.

2. The battery high voltage sampling circuit of claim 1, further comprising a first positive sampling point and a first negative sampling point, wherein:
    the first positive sampling unit is further configured to provide the first positive sampled signal to the first positive sampling point; and
    the first negative sampling unit is further configured to provide the first negative sampled signal to the first negative sampling point.

3. The battery high voltage sampling circuit of claim 2, wherein:
    a first terminal of the first positive sampling unit is connected to the first terminal of the positive relay and the positive electrode of the power battery pack to be detected, and a second terminal of the first positive sampling unit is connected to the first positive sampling point and the reference voltage terminal; and
    a first terminal of the first negative sampling unit is connected to the first terminal of the negative relay and the negative electrode of the battery pack to be detected, and a second terminal of the first negative sampling unit is connected to the first negative sampling point and the reference voltage terminal.

4. The battery high voltage sampling circuit of claim 2, further comprising a first voltage pull-up unit, wherein:
    the first voltage pull-up unit is connected to the first negative sampling point, and the first voltage pull-up unit is configured to pull up the first negative sampled signal to be a positive voltage signal.

5. The battery high voltage sampling circuit of claim 4, wherein:
    the first voltage pull-up unit comprises a first DC voltage source and a fifth resistor network; and
    a terminal of the fifth resistor network is connected to the first negative sampling point, and the other terminal of the fifth resistor network is connected to the first DC voltage source.

6. The battery high voltage sampling circuit of claim 2, wherein:
    the first positive sampling unit comprises a first resistor network and a second resistor network in series;
    a terminal of the first resistor network is connected to the first terminal of the positive relay and the positive electrode of the power battery pack to be detected, and the other terminal of the first resistor network is connected to the first positive sampling point and a terminal of the second resistor network; and
    the other terminal of the second resistor network is connected to the reference voltage terminal.

7. The battery high voltage sampling circuit of claim 6, wherein:
    the first positive sampling unit further comprises a first switch; and
    a terminal of the first resistor network is connected, via the first switch, to the positive electrode of the power battery pack to be detected.

8. The battery high voltage sampling circuit of claim 2, wherein:
    the first negative sampling unit comprises a third resistor network and a fourth resistor network in series;
    a terminal of the third resistor network is connected to the reference voltage terminal, and the other terminal of the third resistor network is connected to the first negative sampling point and a terminal of the fourth resistor network; and
    the other terminal of the fourth resistor network is connected to the first terminal of the negative relay and the negative electrode of the power battery pack to be detected.

9. The battery high voltage sampling circuit of claim 8, wherein:
    the first negative sampling unit further comprises a second switch; and
    a terminal of the third resistor network is connected to the reference voltage terminal via the second switch.

10. The battery high voltage sampling circuit of claim 1, further comprising a second positive sampling point and a second negative sampling point, wherein:
    the second positive sampling unit is further configured to provide the second positive sampled signal to the second positive sampling point; and
    the second negative sampling unit is further configured to provide the second negative sampled signal to the second negative sampling point.

11. The battery high voltage sampling circuit of claim 10, wherein:

a first terminal of the second positive sampling unit is connected to the second terminal of the positive relay, and a second terminal of the second positive sampling unit is connected to the second positive sampling point and the reference voltage terminal; and a first terminal of the second negative sampling unit is connected to the second terminal of the negative relay, and a second terminal of the second negative sampling unit is connected to the second negative sampling point.

12. The battery high voltage sampling circuit of claim 10, further comprising a second voltage pull-up unit, wherein:
the second voltage pull-up unit is connected to the second negative sampling point, and the second voltage pull-up unit is configured to pull up the second negative sampled signal to be a positive voltage signal.

13. The battery high voltage sampling circuit of claim 12, wherein:
the second voltage pull-up unit comprises a second DC voltage source and a tenth resistor network; and
a terminal of the tenth resistor network is connected to the second negative sampling point, and the other terminal of the tenth resistor network is connected to the second DC voltage source.

14. The battery high voltage sampling circuit of claim 10, wherein:
the second positive sampling unit comprises a sixth resistor network and a seventh resistor network in series;
a terminal of the sixth resistor network is connected to the second terminal of the positive relay, and the other terminal of the sixth resistor network is connected to the second positive sampling point and a terminal of the seventh resistor network; and
the other terminal of the seventh resistor network is connected to the reference voltage terminal.

15. The battery high voltage sampling circuit of claim 14, wherein:
the second positive sampling unit further comprises a third switch; and
a terminal of the sixth resistor network is connected to the second terminal of the positive relay via the third switch.

16. The battery high voltage sampling circuit of claim 10, wherein:
the second negative sampling unit comprises an eighth resistor network and a ninth resistor network in series;
a terminal of the eighth resistor network is connected to the reference voltage terminal, and the other terminal of the eighth resistor network is connected to the second negative sampling point and a terminal of the ninth resistor network; and
the other terminal of the ninth resistor network is connected to the second terminal of the negative relay.

17. The battery high voltage sampling circuit of claim 16, wherein:
the second negative sampling unit further comprises a fourth switch; and
a terminal of the eighth resistor network is connected to the reference voltage terminal via the fourth switch.

18. A battery management system, comprising the battery high voltage sampling circuit of claim 1 and a processor connected to the battery high voltage circuit, wherein the processor is configured to:
calculate a voltage at the first terminal of the positive relay based on the first positive sampled signal;
calculate a voltage at the first terminal of the negative relay based on the first negative sampled signal; and
obtain a relay-input voltage of the power battery pack to be detected, based on the voltage at the first terminal of the positive relay and the voltage at the first terminal of the negative relay, wherein the relay-input voltage of the power battery pack to be detected is a voltage between the first terminal of the positive relay and the first terminal of the negative relay.

19. The battery management system of claim 18, wherein the processor is further configured to:
calculate a voltage at the second terminal of the positive relay based on the second positive sampled signal;
calculate a voltage at the second terminal of the negative relay based on the second negative sampled signal; and
obtain a relay-output voltage of the power battery pack to be detected, based on the voltage at the second terminal of the positive relay and the voltage at the second terminal of the negative relay, wherein the relay-output voltage of the power battery pack to be detected is a voltage between the second terminal of the positive relay and the second terminal of the negative relay.

* * * * *